United States Patent
Lin et al.

(10) Patent No.: US 11,187,721 B2
(45) Date of Patent: Nov. 30, 2021

(54) CONTACTOR FOR TESTING ELECTRONIC DEVICE

(71) Applicant: SunASIC Technologies, Inc., Taipei (TW)

(72) Inventors: Chi-Chou Lin, Taipei (TW); Hsien-Hsueh Lee, Taipei (TW); Zheng-Ping He, Taipei (TW)

(73) Assignee: SunASIC Technologies, Inc., Taipei (TW)

( * ) Notice: Subject to any disclaimer, the term of this patent is extended or adjusted under 35 U.S.C. 154(b) by 76 days.

(21) Appl. No.: 16/780,595

(22) Filed: Feb. 3, 2020

(65) Prior Publication Data

US 2021/0239733 A1    Aug. 5, 2021

(51) Int. Cl.
*G01R 1/04* (2006.01)
*H05K 1/11* (2006.01)
*G01R 1/073* (2006.01)
*H05K 1/09* (2006.01)

(52) U.S. Cl.
CPC .......... *G01R 1/0408* (2013.01); *G01R 1/073* (2013.01); *H05K 1/09* (2013.01); *H05K 1/115* (2013.01); *H05K 1/118* (2013.01)

(58) Field of Classification Search
CPC ...... G01R 1/0408; G01R 1/073; H05K 1/118; H05K 1/09; H05K 1/115
USPC ................................................... 324/750.25
See application file for complete search history.

(56) References Cited

U.S. PATENT DOCUMENTS

| | | | | |
|---|---|---|---|---|
| 6,636,057 B1* | 10/2003 | Uchikura | ........... | G01R 1/07371 324/756.05 |
| 2011/0248734 A1* | 10/2011 | Takeda | ............... | G01R 31/2867 324/750.03 |
| 2014/0103943 A1* | 4/2014 | Dunlap | ................ | G01N 27/221 324/663 |
| 2016/0104024 A1* | 4/2016 | Slogedal | ............ | G06K 9/00033 324/649 |

* cited by examiner

*Primary Examiner* — Farhana A Hoque
(74) *Attorney, Agent, or Firm* — Demian K. Jackson; Jackson IPG PLLC

(57) ABSTRACT

An electronic device having a structure that electrically connects the contactor to an electronic device during a testing process is disclosed. The contactor includes a holder for accommodating the electronic device during the testing process; a flexible circuit, having a first set of contacts electrically connected to the corresponding electrode terminals of the electronic device, and a second set of contacts electrically connected to a control unit that sends test signals during the test process; an elastomer, for adjusting the pressure between the first set of contacts of the flexible circuit and the corresponding electrode terminals of the electronic device while being pressed together; and an alignment tool, for aligning the first set of contacts with the corresponding electrode terminals of the electronic device. The electrode terminals of the electronic device are located on the same surface of the electronic device and the flexible circuit is detachable from the contactor.

11 Claims, 7 Drawing Sheets

(Prior Art)

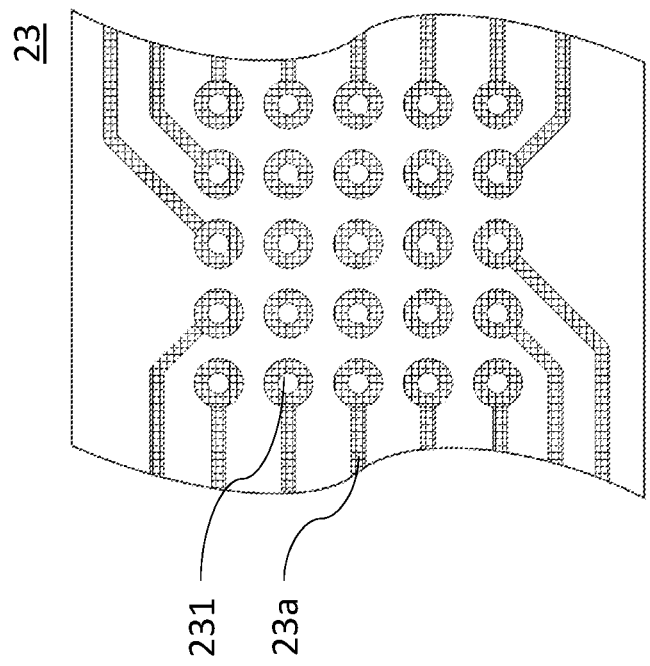
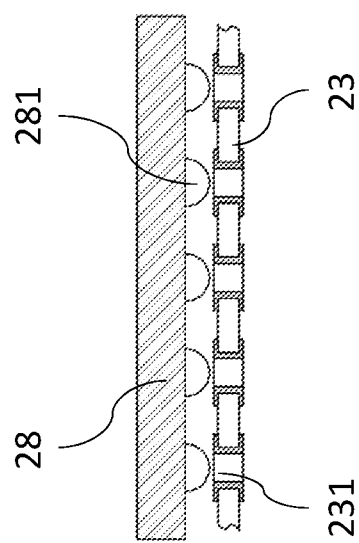
Fig. 6A
Fig. 6B

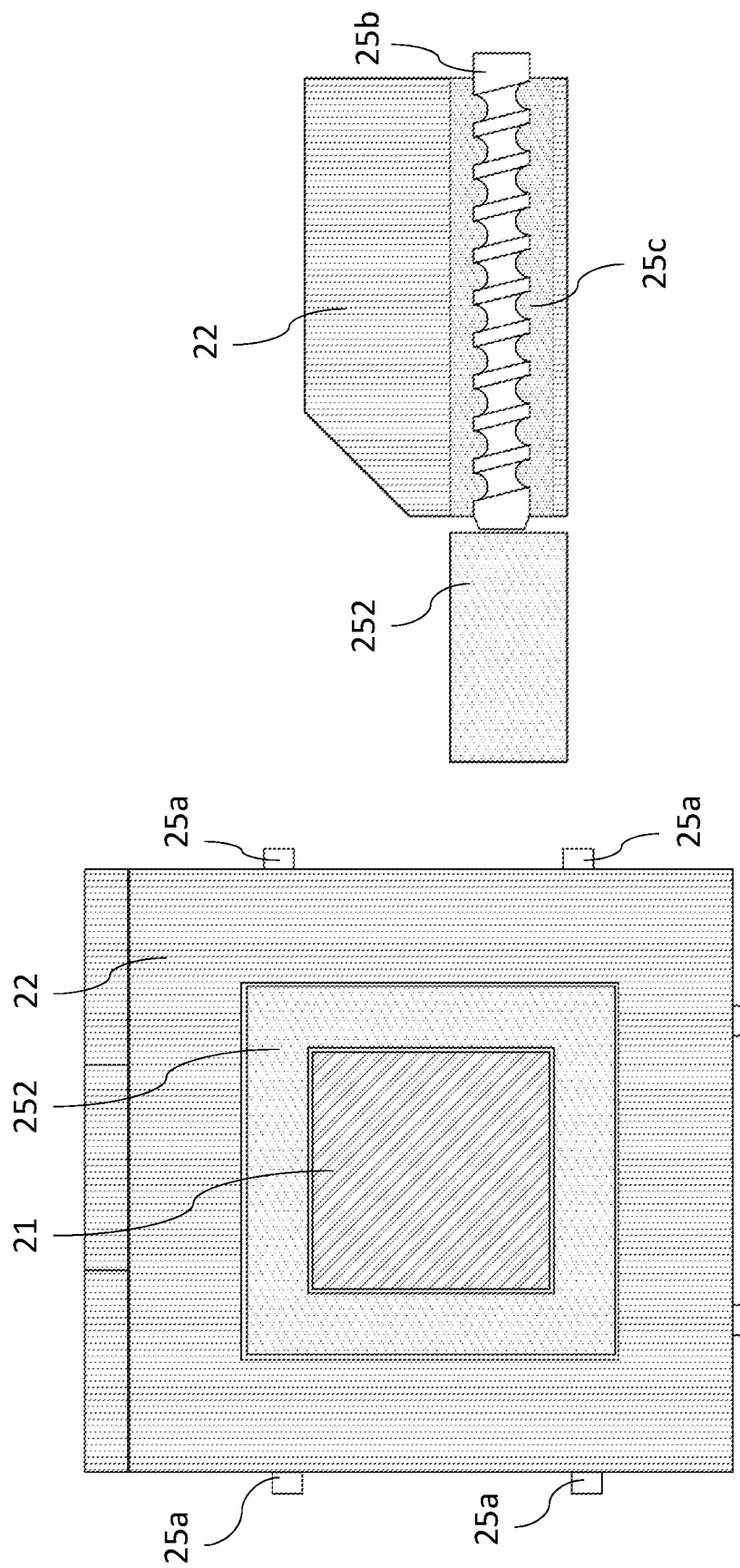

CONTACTOR FOR TESTING ELECTRONIC DEVICE

FIELD OF THE INVENTION

The present invention relates to contactors for testing an electronic device. More particularly, the present invention relates to a contactor for characteristic testing of a semiconductor integrated circuit device such as a chip-scale package (CSP) devices, a flip-chip device, or a ball grid array (BGA) device.

BACKGROUND OF THE INVENTION

In recent years, a reduction in thickness and in weight of portable electronic equipment and IoT device increases the demand for miniaturization of the package of semiconductor integrated circuit devices. The chip-scale package (CSP) is one of the best package methods for an IC to fit the miniaturization requirement of an IoT device. In a CSP, the die may be mounted on an interposer where pads or balls are formed on, similar to that of flip-chip ball grid array (BGA) packaging, or the pads may be etched or printed directly onto the wafer.

An IC tester is used for performing a characteristic test by supplying electric power and electric signals to the packaged IC. A contactor such as an IC socket is often used as an interface to connect an IC to the IC tester. Conventional contactors use probe pins, each incorporating a coil spring to contact with the terminals of a packaged IC. The probe pins are movable in a vertical direction to adjust the contact pressure.

U.S. Pat. No. 6,636,057 disclosed one conventional electrical socket having a pin and a spring. U.S. Pat. No. 7,471,096 disclosed another conventional electrical socket having a conductive elastic contact pin. As shown in FIG. 1, the contactor 10 includes a plurality of contact pieces 11. each of the contact pieces 11 comprises a contact pin 11c and a first contact portion 11a provided in an upper portion of contact pin 11c. The lower end of the contact pin 11c serves as a second contact portion 11b, which is brought into contact with a terminal 13a formed and arranged on the substrate 13. The contact pin 11c is bent beforehand in an elbow shape to be easily deformed when being pressed from both ends. Both prior arts provided a reliable connection for a device under test to connect with a tester.

Mis-test may be aroused by many possible causes, including dirt and oxides, that accumulate on the device pin and socket pin. Misalignment will also result in mis-test, as misalignment causes a part to be damaged, lost or falsely tested. U.S. Pat. No. 6,636,057 mentioned a knurl formed on the terminal contact surface to maintain a secure electrical connection thereof. However, both prior arts are silent about the maintenance or replacement of the pins. In fact, these pins must be replaced after a certain number of uses, usually tens of thousands of uses. In addition, the cost to manufacture the pins is high, particularly for today's high-density packages, and the replacement is time-consuming work.

Therefore, in order to resolve the problems mentioned above, a low-cost and easy-to-replace tool for the contactor is desired.

SUMMARY OF THE INVENTION

This paragraph extracts and compiles some features of the present invention; other features will be disclosed in the follow-up paragraphs. It is intended to cover various modifications and similar arrangements included within the spirit and scope of the appended claims.

In order to settle the problems mentioned above, a contactor for testing an electronic device is provided. The contactor comprises: a holder, having a concave portion for holding and fixing the electronic device during a testing process; a flexible circuit, having a first set of contacts electrically connected to the corresponding electrode terminals of the electronic device, and a second set of contacts electrically connected to a control unit that sends test signals during the testing process; an elastomer, for adjusting the pressure between the first set of contacts of the flexible circuit and the corresponding electrode terminals of the electronic device while being pressed together; and an alignment tool, for aligning the first set of contacts with the corresponding electrode terminals of the electronic device. The electrode terminals of the electronic device are located on the same surface of the electronic device. The flexible circuit is detachable from the contactor.

Preferably, the electronic device may be a chip-scale package (CSP) device, a flip-chip device, or a ball grid array (BGA) device. The contactor may further comprises a press-down cover above the concave portion of the holder to fasten the electronic device to the flexible circuit. The contactor may further comprise a substrate for the holder to fix thereto, wherein the substrate comprises a set of connectors for the second set of contacts to connect to the control unit. The connectors may be flexible flat cable (FFC) connectors, and the second set of contacts may be in the form of FFC contacts. The substrate may be a printed circuit board (PCB) where the control unit is mounted thereon.

According to the present invention, the first set of contacts are plated with gold or gold alloy. The elastomer comprises a set of protrusions corresponding to the first set of contacts to provide extra force to enhance the pressure between the first set of contacts and corresponding electrode terminals of the electronic device. The first set of contacts may be in the form of via holes. The alignment tool may comprise a set of locating pins formed on the holder and a movable frame with a set of corresponding locating holes formed thereon to be engaged with the locating pins. There is also a set of corresponding locating holes formed on the flexible circuit and the elastomer, respectively, for engaging with locating pins. The alignment tool may comprise a movable frame and a set of linear actuators for adjusting position between the movable frame and the holder.

BRIEF DESCRIPTION OF THE DRAWINGS

FIG. 6A shows a side view of an electronic device and a flexible circuit in a second embodiment.

FIG. 6B shows a top view of the flexible circuit in FIG. 6A.

FIG. 7A shows a top view of the frame and the holder with the linear actuators.

FIG. 7B shows a cross-section view of a portion of the holder and one of the linear actuators built therein.

DETAILED DESCRIPTION OF THE PREFERRED EMBODIMENT

The present invention will now be described more specifically with reference to the following embodiment.

Figure 1:
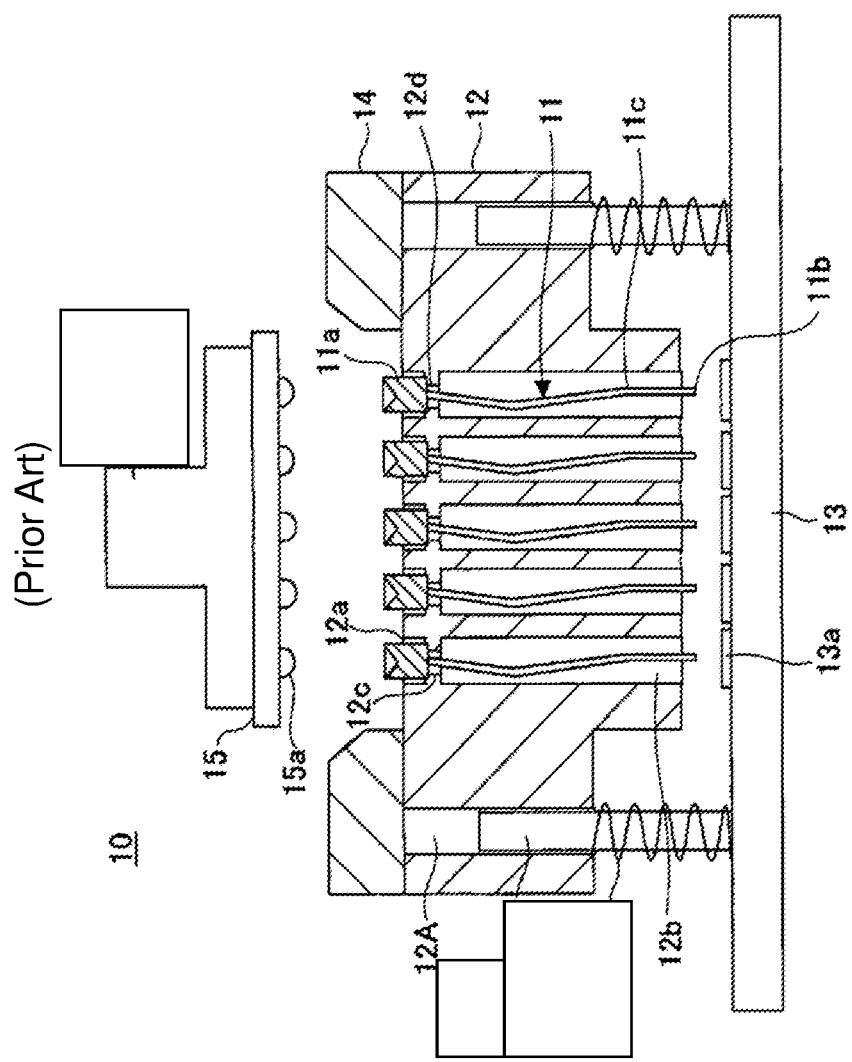
FIG. 1 is a cross-sectional view of a conventional contactor.
Figure 2:
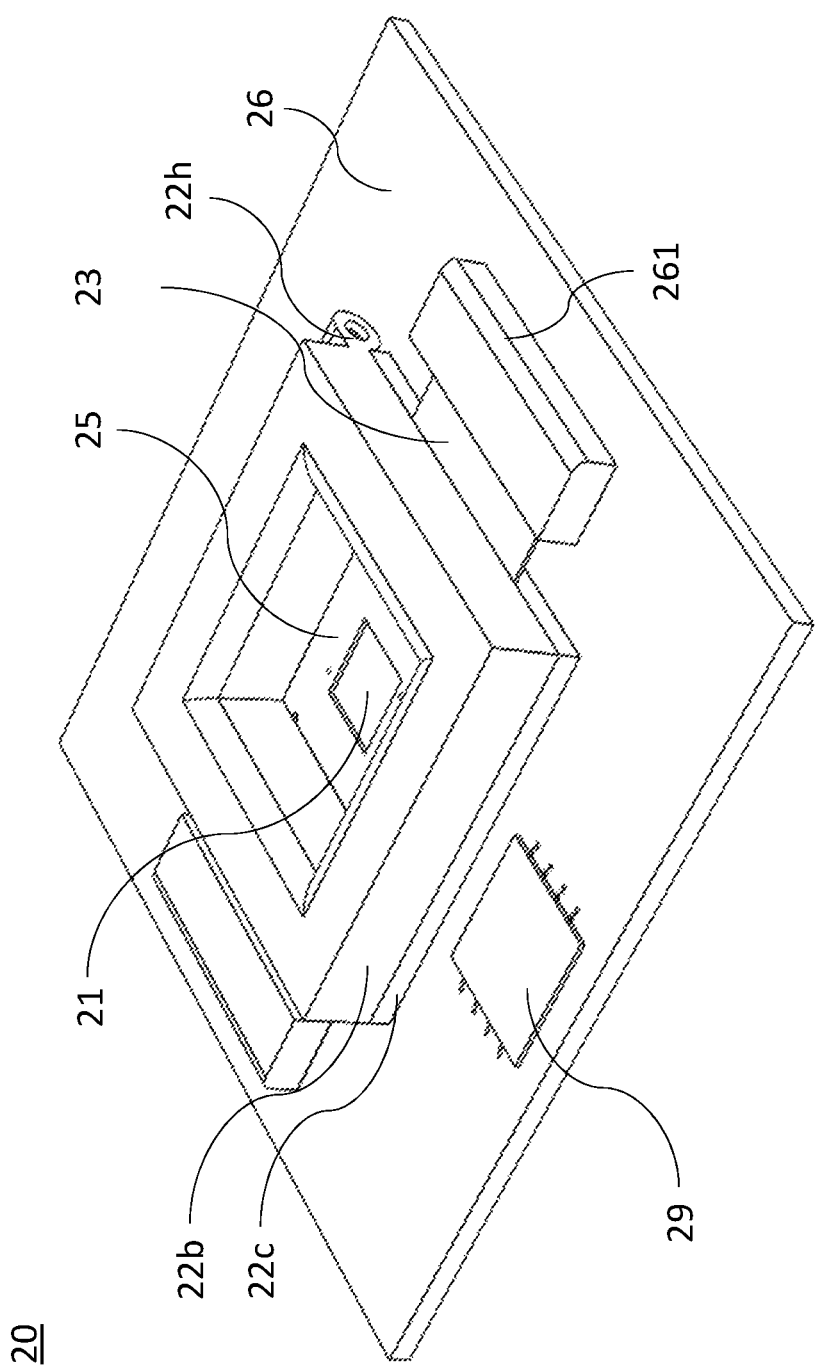
FIG. 2 is a perspective view of a contactor for testing an electronic device to make an electric connection to a plurality of electrode terminals of the electronic device.
Figure 3:
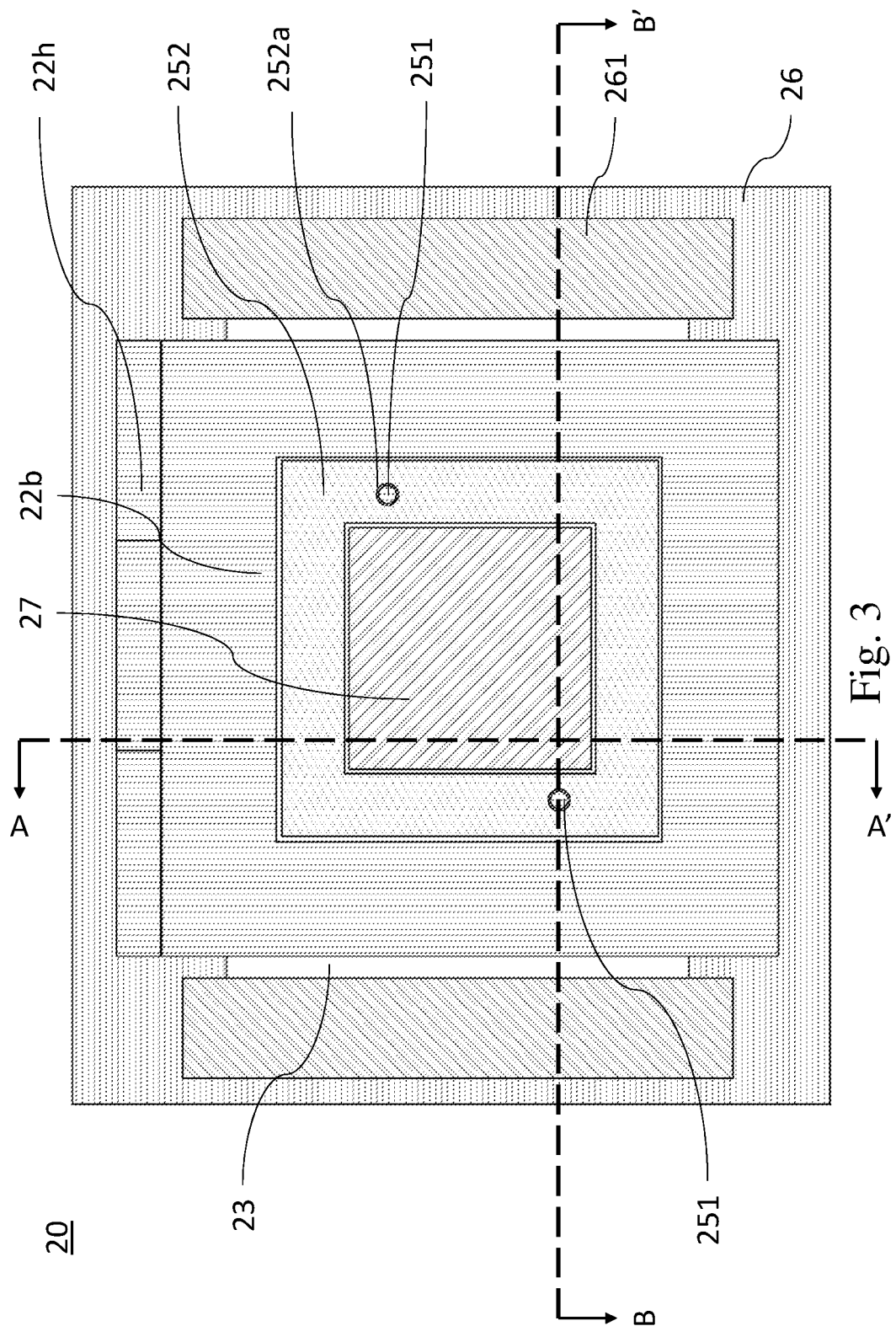
FIG. 3 shows the top view of a portion of the contactor in FIG. 2.
Figure 4:
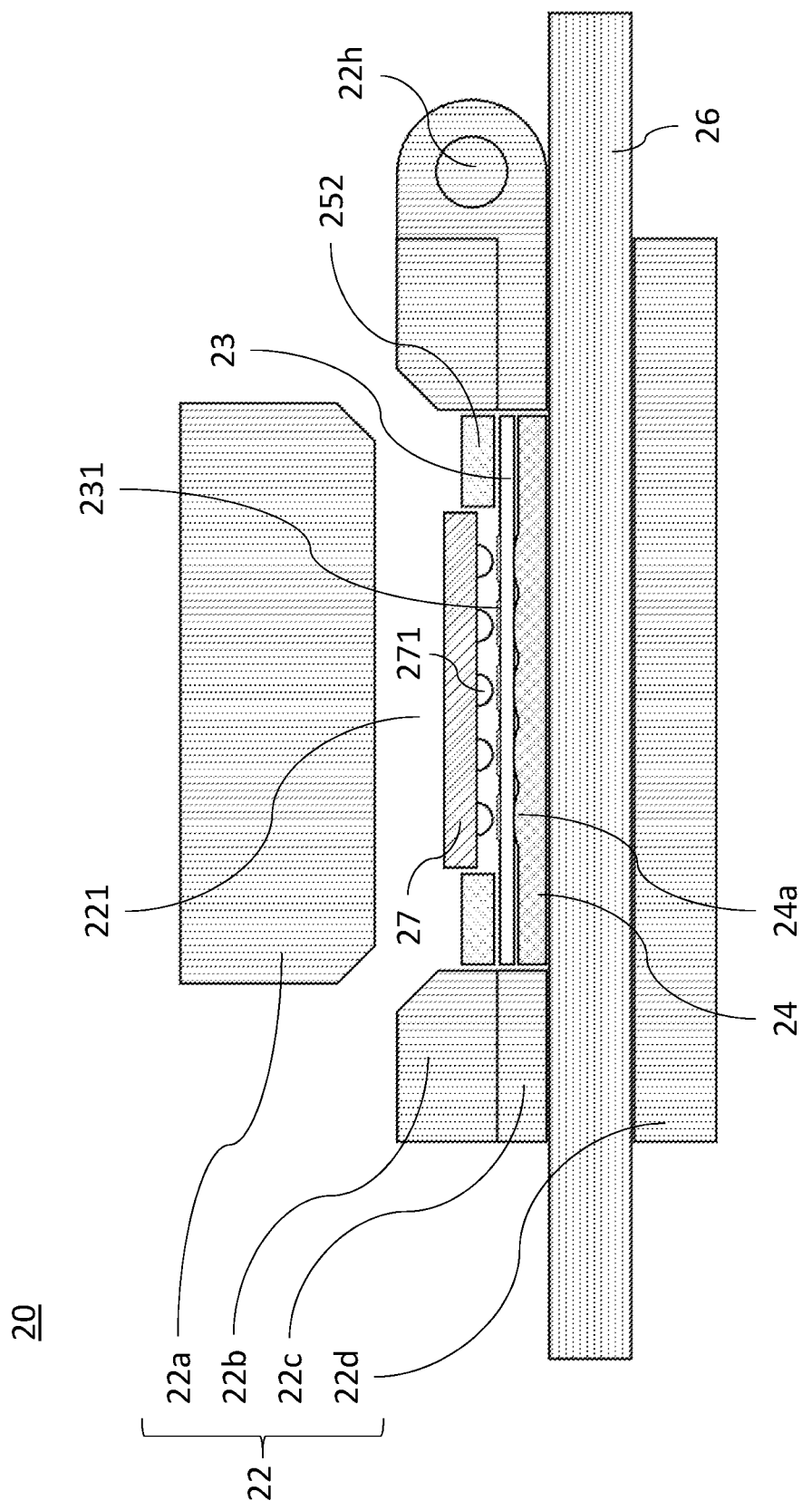
FIG. 4 is a cross-section view along the AA' line in FIG. 3.
Figure 5:
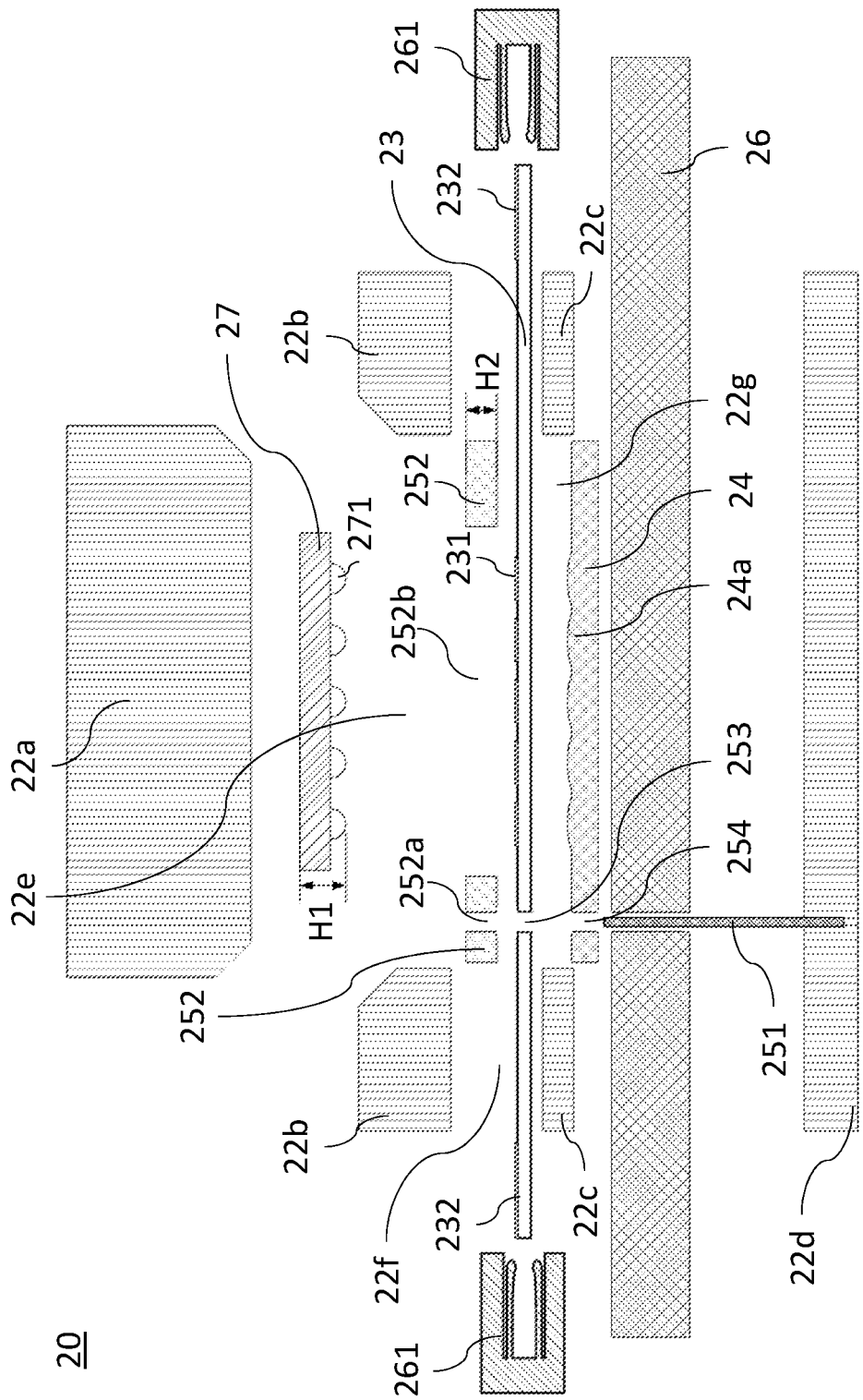
FIG. 5 is a cross-section view along the BB' line in FIG. 3.

Please refer to FIG. 2 to FIG. 4. FIG. 2 shows a contactor 20 for testing an electronic device 21 to make an electrical connection to a plurality of electrode terminals 211 of the electronic device 21. In the first embodiment, the electronic device 21 is a chip-scale package (CSP) device 27. The electronic device 21 may be a device having all the electrode terminals 211 located on the same surface, e.g., a CSP device, a flip-chip device, or a ball grid array (BGA) device. FIG. 3 is the top view of a portion of the contactor 20. FIG. 4 is a cross-section view along the AA' line in FIG. 3. FIG. 5 is a cross-section view along the BB' line in FIG. 3. It should be understood that the components are slightly separated in FIG. 5 merely to clearly express the relative positions of each component. The contactor 20 includes: a holder 22, a flexible circuit 23, an elastomer 24, and an alignment tool 25.

The holder 22 has a concave portion 221 for holding and fixing the CSP device 27 during a testing process. In the present embodiment, the holder 22 has a press-down cover 22a, an upper part 22b, a middle part 22c, and a lower part 22d, as shown in FIG. 4. The press-down cover 22a is placed above the CSP device 27 to fasten the CSP device 27 to the flexible circuit 23. It should be noticed that the press-down cover 22a is neglected in FIG. 2 and FIG. 3. The CSP device 27 includes a set of electrode terminals 271 at the bottom side thereof. An alternative device, e.g., a picker of a robotic arm, may be used to press down the CSP device 27. In the present embodiment, the electrode terminals 271 are solder balls. The holder 22 may be composed of several parts but not limited to the press-down cover 22a, the upper part 22b, the middle part 22c, and the lower part 22d. As shown in FIG. 5, a first opening 22e is located at the center of the upper part 22b forming the concave portion 221 of the holder 22. The middle part 22c has a recession 22f for the flexible circuit 23 to fit therein. The middle part 22c also has a second opening 22g for the elastomer 24 to be placed into. The upper part 22b can be left up easily for a user to exchange the flexible circuits. A hinge 22h may be used to connect the upper part 22b and the middle part 22c. The holder 22 is fixed on a substrate 26, e.g. a printed circuit board (PCB). In the present embodiment, the holder 22 is fixed on a PCB 26 by the lower part 22d and the middle part 22c, as shown in FIGS. 4 and 5. There may be clip locks (not shown) located on the opposite side of the hinge 22h of the holder 22 for hooking the upper part 22b to the middle part 22c, as shown in FIGS. 2 and 4. Any tool that can lock the upper part 22b to the middle part 22c during the testing process and can be easily unlocked when replacing the flexible circuit 23 can be used here. The middle part 22c and the lower part 22d may be fixed together by screws (not shown).

The flexible circuit 23 may be formed by etching a copper foil cladding from insulating polymer bases into circuit patterns and then covering the circuit patterns with a polymer coating to protect it. The flexible circuit 23 has two sets of contacts that are not covered by the polymer coating. The contacts can be plated with gold or gold alloy to increase durability. The contacts can be plated with other common plating materials, such as tin, nickel, silver, electroless nickel with immersion gold (ENIG), electroless nickel/palladium immersion gold (ENEPIG). Platinum group metals may be plated on the contacts to protect against corrosion.

The first set of contacts 231 are used to electrically connect to the corresponding electrode terminals 271 of the CSP device 27. Therefore, the first set of contacts 231, formed on a top surface of the flexible circuit 23, has a pattern that is the same as the distribution of the corresponding electrode terminals 271 of the CSP device 27. The size of each contact is the same as or slightly larger than the size of the corresponding electrode terminals 271 of the CSP device 27. The second set of contacts 232 are electrically connected to a control unit 29 that sends test signals during the testing process. The control unit 29 may be mounted on a PCB 26, and a plurality of traces (not shown) are formed on the PCB 26 to connect the second set of contacts 232 to corresponding pins of the control unit 29. In another embodiment, the control unit 29 may be assembled in another device and connect to the second set of contacts 232 on the PCB 26 via a connector (not shown), e.g. a USB interface. The flexible circuit 23 is detachable from the contactor 20 and the PCB 26. For example, there may be connectors 261 mounted on the PCB 26 and connect the flexible circuit 23 to corresponding traces. The connectors 261 make it easy to replace a worn flexible circuit 23 with a new one. The connectors 261 may be flexible flat cable (FFC) connectors. The second set of contacts 232 may be in the form of regular FFC contacts that fit corresponding connectors 261. For example, the connector is a 20-pins connector having a pitch of 0.5 mm.

The elastomer 24 is placed beneath the flexible circuit 23. The elastomer 24 is designed to adjust the pressure between the first set of contacts 231 of the flexible circuit 23 and the corresponding electrode terminals 271 of the CSP device 27 while being pressed together. The center of the CSP device 27, the first set of contacts 231, and the elastomer 24 are approximately aligned vertically. The elastomer 24 may have a larger area than the size of the CSP device 27 from the top view. The elastomer 24 may include a set of protrusions 24a corresponding to the first set of contacts 231 to provide extra force to enhance pressure between the first set of contacts 231 and corresponding electrode terminals 271 of the CSP device 27. Therefore, a secure electrical connection between the CPS device and the flexible circuit 23 will be established while being pressed together. The protrusions 24a may have a crater formed at the center of the tip for the electrode terminals 271 better fit therein.

Various types of tools can be used as the alignment tool 25, as long as they meet the accuracy and precision requirement of the contactor 20. In the present embodiment, the alignment tool 25 includes a set of locating pins 251 (or locating pillars) onto the holder 22 and a movable frame 252 with a first set of corresponding locating holes 252a formed thereon to be engaged with the locating pins 251. There are also a second set of corresponding locating holes 253 formed on the flexible circuit 23, and a third set of corresponding locating holes 254 formed on the elastomer 24 to engage with the locating pins 251. The size of an inner opening 252b of the movable frame 252 has the same as or slightly larger than the size of the CSP device 27 for the CSP device 27 to fit therein. The height of the movable frame 252 (H2) is slightly less than a total height of the CSP device 27 (H1), as shown in FIG. 5. Therefore, the electrode terminals 271 of the CSP device 27 will be slightly protruded beyond the lower surface of the movable frame 252 to contact the first set of contacts when the press-down cover 22a of the contactor 20 is pressed down. The alignment tool is used to align the first set of contacts 231 with the corresponding electrode terminals 271 of the CSP device 27.

Please refer to FIG. 6A and FIG. 6B. FIG. 6A shows a side view of an electronic device and a flexible circuit 23 in a second embodiment, and FIG. 6B shows a top view of the flexible circuit 23 in FIG. 6A. The electronic device is a BGA device 28 in the second embodiment. Only a portion of the flexible circuit 23 around the first set of contacts 231 is shown in the figures. The first set of contacts 231 are in the form of via holes, i.e., plated through-holes. The via has a diameter smaller than the diameter of the electrode terminals 281 of the BGA device 28, and maybe plated with gold or gold alloy. The via holes make it easier for the electrode terminals 281 to fit therein. In other words, the soldering balls will engage the corresponding holes while the BGA device 28 is pressed down by the press-down cover 22a of the holder 22. The traces 23a may be formed on both the top and bottom layers of the flexible circuit 23, and are used to connect the first set of contacts to the second set of contacts. Protective layers are formed on both sides of the flexible circuit 23 except the location of the first and second sets of contacts, in order to protect the traces 23a.

In another embodiment, the holder 22 may include different types of alignment tools. For example, a set of linear actuators are placed around the holder 22 to adjust the position of the movable frame 252 and to align the first set of contacts 231 with the corresponding electrode terminals 211 of the electronic device 21. Please refer to FIG. 7A and FIG. 7B. FIG. 7A shows a top view of the movable frame 252 and the holder 22 with the linear actuators 25a. FIG. 7B shows a cross-section view of a portion of the holder 22 and one of the linear actuators 25a built therein. In the present embodiment, a pair of leadscrew 25b and nut 25c is used to form the linear actuator 25a. Other types of linear actuators, e.g., ball screws, piezoelectric actuation, etc., may also be used here. The accuracy and resolution of the linear actuator are designed to fit the dimension of the package. For example, the singulation tolerance of the finished devices 27 may vary +/−50 μm, which results in a variation of the BGA location tolerance of the same amount.

While the invention has been described in terms of what is presently considered to be the most practical and preferred embodiment, it is to be understood that the invention needs not to be limited to the disclosed embodiment. On the contrary, it is intended to cover various modifications and similar arrangements included within the spirit and scope of the appended claims, which are to be accorded with the broadest interpretation to encompass all such modifications and similar structures.

What is claimed is:

1. A contactor for testing an electronic device to make an electric connection to a plurality of electrode terminals of the electronic device, comprising:
   a holder, having a concave portion for holding and fixing the electronic device during a testing process;
   a flexible circuit, having a first set of contacts electrically connected to the corresponding electrode terminals of the electronic device, and a second set of contacts electrically connected to a control unit that sends test signals during the testing process;
   an elastomer, placed beneath the flexible circuit, for adjusting the pressure between the first set of contacts of the flexible circuit and the corresponding electrode terminals of the electronic device while the electronic device and the flexible circuit are pressed together; and
   an alignment tool, for aligning the first set of contacts with the corresponding electrode terminals of the electronic device,
   wherein the electrode terminals of the electronic device are located on the same surface of the electronic device; the flexible circuit is detachable from the contactor and sandwiched between the electronic device and the elastomer.

2. The contactor according to claim 1, wherein the electronic device is a chip-scale package (CSP) device, a flip-chip device, or a ball grid array (BGA) device.

3. The contactor according to claim 1, further comprising a press-down cover above the concave portion of the holder to fasten the electronic device to the flexible circuit.

4. The contactor according to claim 1, further comprising a substrate for the holder to fix thereto, wherein the substrate comprises a set of connectors for the second set of contacts to connect to the control unit.

5. The contactor according to claim 4, wherein the connectors are flexible flat cable (FFC) connectors, and the second set of contacts are in the form of FFC contacts.

6. The contactor according to claim 4, wherein the substrate is a printed circuit board (PCB) where the control unit is mounted thereon.

7. The contactor according to claim 1, wherein the first set of contacts are plated with gold or gold alloy.

8. The contactor according to claim 1, wherein the elastomer comprises a set of protrusions corresponding to the first set of contacts to provide extra force to enhance the pressure between the first set of contacts and corresponding electrode terminals of the electronic device.

9. The contactor according to claim 1, wherein the first set of contacts are in the form of via holes.

10. The contactor according to claim 1, wherein the alignment tool comprises a set of locating pins formed on the holder for engaging with a set of corresponding locating holes formed on the flexible circuit and the elastomer, respectively; and a movable frame with a set of corresponding locating holes formed thereon to be engaged with the locating pins.

11. The contactor according to claim 1, wherein the alignment tool comprises a movable frame; and a set of linear actuators, for adjusting position between the movable frame and the holder.

* * * * *